(12) United States Patent
Xiang et al.

(10) Patent No.: US 12,609,163 B2
(45) Date of Patent: Apr. 21, 2026

(54) MEMORY DEVICE AND OPERATION METHOD THEREOF

(71) Applicant: Yangtze Memory Technologies Co., Ltd., Hubei (CN)

(72) Inventors: Li Xiang, Wuhan (CN); Ke Liang, Wuhan (CN); Jinchi Han, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 140 days.

(21) Appl. No.: 18/307,700

(22) Filed: Apr. 26, 2023

(65) Prior Publication Data

US 2024/0331775 A1 Oct. 3, 2024

Related U.S. Application Data

(63) Continuation of application No. PCT/CN2023/085325, filed on Mar. 31, 2023.

(51) Int. Cl.
*G11C 16/10* (2006.01)
*G11C 16/04* (2006.01)
*G11C 16/28* (2006.01)

(52) U.S. Cl.
CPC ........ *G11C 16/102* (2013.01); *G11C 16/0433* (2013.01); *G11C 16/28* (2013.01)

(58) Field of Classification Search
CPC ... G11C 16/102; G11C 16/0433; G11C 16/28; G11C 16/08; G11C 16/24;
(Continued)

(56) References Cited

U.S. PATENT DOCUMENTS

| | | | |
|---|---|---|---|
| 10,115,464 B1 | 10/2018 | Lu et al. | |
| 2002/0003722 A1* | 1/2002 | Kanda ................... | G11C 16/10 365/185.17 |

(Continued)

FOREIGN PATENT DOCUMENTS

| | | |
|---|---|---|
| CN | 113196402 A | 7/2021 |
| WO | WO 2016160071 A1 | 10/2016 |
| WO | WO 2020214217 A1 | 10/2020 |

OTHER PUBLICATIONS

International Search Report and Written Opinion in International Appln. No. PCT/CN2023/085325, mailed on Jun. 23, 2023, 8 pages.

(Continued)

*Primary Examiner* — Amir Zarabian
*Assistant Examiner* — Bradley S Coon
(74) *Attorney, Agent, or Firm* — Fish & Richardson P.C.

(57) ABSTRACT

Example memory devices, memory systems, and methods for reducing program disturb in NAND flash memory are disclosed. One example method includes applying, at a first time, a first voltage to a first select line coupled to a first select gate transistor, where the memory device includes a memory cell array. The memory cell array includes a memory string. The memory string includes the first select gate transistor, multiple memory cells, and a source select gate transistor. The multiple memory cells are positioned between the first select gate transistor and the source select gate transistor. The source select gate transistor is coupled to a source line of the memory cell array. A second voltage is applied at a second time to the first select line, where the second time is after the first time, and the second voltage is larger than the first voltage.

20 Claims, 13 Drawing Sheets

(58) Field of Classification Search
CPC ..... G11C 16/3427; G11C 16/32; G11C 16/10;
G11C 16/26; G11C 16/0483
See application file for complete search history.

(56) References Cited

U.S. PATENT DOCUMENTS

| | | | | |
|---|---|---|---|---|
| 2006/0256620 | A1 | 11/2006 | Nguyen et al. | |
| 2009/0268523 | A1 | 10/2009 | Maejima | |
| 2010/0238729 | A1* | 9/2010 | Lee ..................... | G11C 11/5628 |
| | | | | 365/185.11 |
| 2011/0199827 | A1 | 8/2011 | Puzzilli et al. | |
| 2014/0029345 | A1 | 1/2014 | Goda et al. | |
| 2017/0076799 | A1 | 3/2017 | Namai | |
| 2020/0051648 | A1* | 2/2020 | Yang ................... | G11C 16/3418 |
| 2020/0066350 | A1* | 2/2020 | Moschiano ........ | G11C 16/3427 |
| 2020/0402584 | A1* | 12/2020 | Lee ........................ | G11C 16/10 |
| 2022/0358995 | A1 | 11/2022 | Cp et al. | |
| 2023/0085034 | A1 | 3/2023 | Fukuzumi et al. | |
| 2023/0128177 | A1* | 4/2023 | Oowada ............. | G11C 16/0483 |
| | | | | 365/185.17 |

OTHER PUBLICATIONS

Office Action in Chinese Appln. No. 202380009066.4, mailed on
Sep. 16, 2025, 24 pages (with English translation).
Extended European Search Report in European Appln. No. 23929357.
4, mailed on Mar. 5, 2026, 11 pages.
Office Action in Chinese Appln. No. 202380009066.4, mailed on
Feb. 11, 2026, 24 pages (with English translation).

* cited by examiner

101

108

113

118

206
208

204

115

Z

X/Y

202

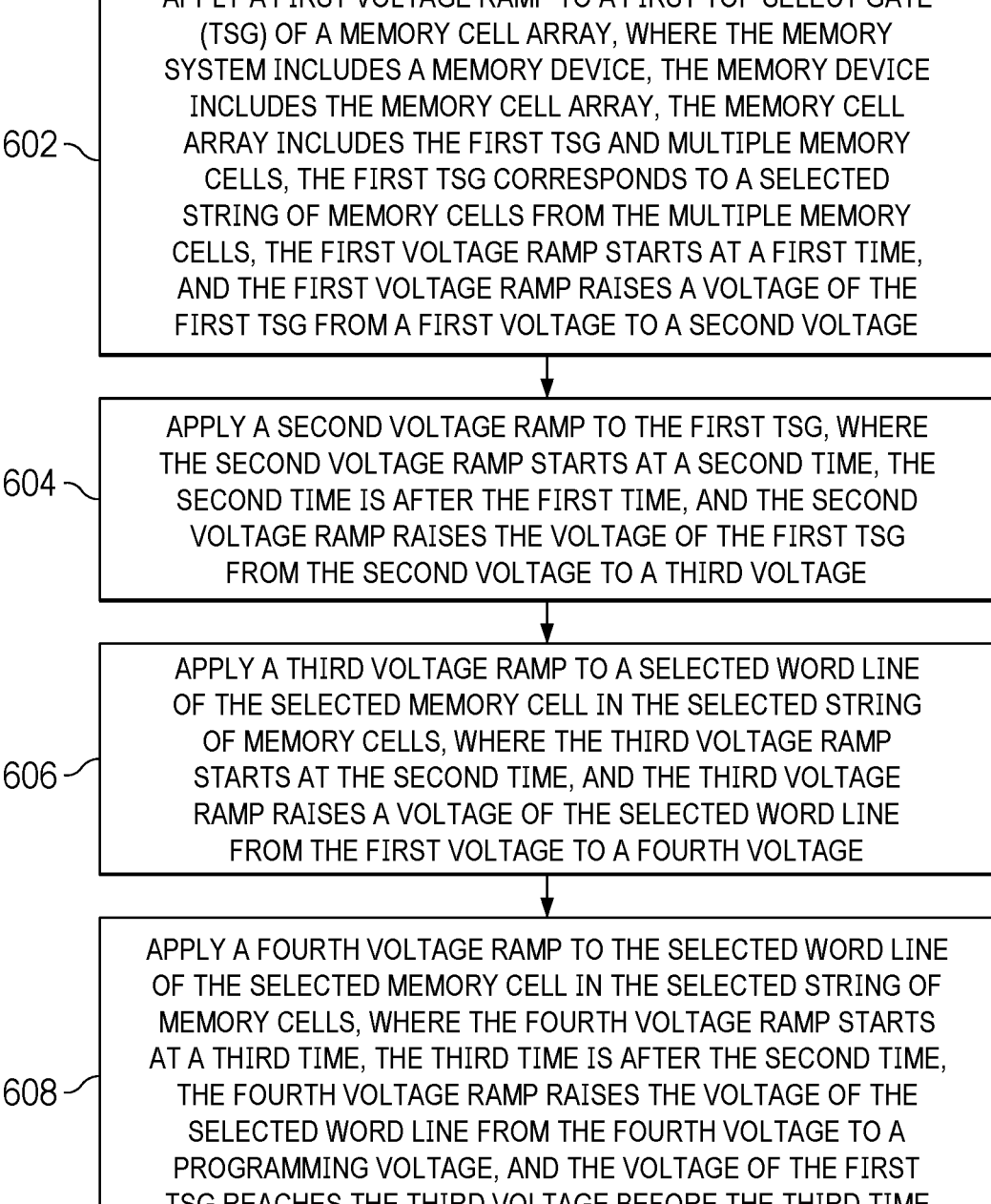

602 — APPLY A FIRST VOLTAGE RAMP TO A FIRST TOP SELECT GATE (TSG) OF A MEMORY CELL ARRAY, WHERE THE MEMORY SYSTEM INCLUDES A MEMORY DEVICE, THE MEMORY DEVICE INCLUDES THE MEMORY CELL ARRAY, THE MEMORY CELL ARRAY INCLUDES THE FIRST TSG AND MULTIPLE MEMORY CELLS, THE FIRST TSG CORRESPONDS TO A SELECTED STRING OF MEMORY CELLS FROM THE MULTIPLE MEMORY CELLS, THE FIRST VOLTAGE RAMP STARTS AT A FIRST TIME, AND THE FIRST VOLTAGE RAMP RAISES A VOLTAGE OF THE FIRST TSG FROM A FIRST VOLTAGE TO A SECOND VOLTAGE

604 — APPLY A SECOND VOLTAGE RAMP TO THE FIRST TSG, WHERE THE SECOND VOLTAGE RAMP STARTS AT A SECOND TIME, THE SECOND TIME IS AFTER THE FIRST TIME, AND THE SECOND VOLTAGE RAMP RAISES THE VOLTAGE OF THE FIRST TSG FROM THE SECOND VOLTAGE TO A THIRD VOLTAGE

606 — APPLY A THIRD VOLTAGE RAMP TO A SELECTED WORD LINE OF THE SELECTED MEMORY CELL IN THE SELECTED STRING OF MEMORY CELLS, WHERE THE THIRD VOLTAGE RAMP STARTS AT THE SECOND TIME, AND THE THIRD VOLTAGE RAMP RAISES A VOLTAGE OF THE SELECTED WORD LINE FROM THE FIRST VOLTAGE TO A FOURTH VOLTAGE

608 — APPLY A FOURTH VOLTAGE RAMP TO THE SELECTED WORD LINE OF THE SELECTED MEMORY CELL IN THE SELECTED STRING OF MEMORY CELLS, WHERE THE FOURTH VOLTAGE RAMP STARTS AT A THIRD TIME, THE THIRD TIME IS AFTER THE SECOND TIME, THE FOURTH VOLTAGE RAMP RAISES THE VOLTAGE OF THE SELECTED WORD LINE FROM THE FOURTH VOLTAGE TO A PROGRAMMING VOLTAGE, AND THE VOLTAGE OF THE FIRST TSG REACHES THE THIRD VOLTAGE BEFORE THE THIRD TIME

FIG. 6

MEMORY DEVICE AND OPERATION METHOD THEREOF

CROSS-REFERENCE TO RELATED APPLICATIONS

This application is a continuation of International Application No. PCT/CN2023/085325, filed on Mar. 31, 2023, the disclosure of which is hereby incorporated by reference in its entirety.

TECHNICAL FIELD

The present disclosure relates to memory devices, memory systems, and methods for reducing program disturb in flash memory.

BACKGROUND

Flash memory is a low-cost, high-density, nonvolatile solid-state storage medium that can be electrically erased and reprogrammed. Flash memory includes NOR flash memory and NAND flash memory. Various operations can be performed by flash memory, for example, program (write) and erase operations, to change the threshold voltage of each memory cell to a respective level. For NAND flash memory, an erase operation can be performed at the block level, a program operation can be performed at the page level, and a read operation can be performed at the page level.

SUMMARY

The present disclosure involves memory devices, memory systems, and methods for reducing program disturb in NAND flash memory. One example method includes applying, at a first time, a first voltage to a first select line coupled to a first select gate transistor, where the memory device includes a memory cell array. The memory cell array includes a memory string. The memory string includes the first select gate transistor, multiple memory cells, and a source select gate transistor. The multiple memory cells are positioned between the first select gate transistor and the source select gate transistor, and the source select gate transistor is coupled to a source line of the memory cell array. A second voltage is applied at a second time to the first select line coupled to the first select gate transistor, where the second time is after the first time, and the second voltage is larger than the first voltage.

While generally described as computer-implemented software embodied on tangible media that processes and transforms the respective data, some or all of the aspects may be computer-implemented methods or further included in respective systems or other devices for performing this described functionality. The details of these and other aspects and implementations of the present disclosure are set forth in the accompanying drawings and the description below. Other features, objects, and advantages of the disclosure will be apparent from the description and drawings, and from the claims.

BRIEF DESCRIPTION OF DRAWINGS

FIG. 6 illustrates an example of a flow chart of a method for reducing program disturb in a memory device, according to some aspects of the present disclosure.

Like reference numbers and designations in the various drawings indicate like elements.

DETAILED DESCRIPTION

This specification relates to memory devices, memory systems, methods, and media for reducing program disturb in NAND flash memory. In some cases, during the program (write) operation of a memory string in a block of memory cells in some memory devices, such as NAND flash memory devices, the voltage of a bit line coupled to another memory string that is not being programmed can float before the voltage on a select gate line coupled to a select gate transistor ramps up. The voltage of the select gate line coupled to the select gate transistor can ramp up to a target voltage before the voltages of the word lines in the block, including dummy word lines, ramp up. When the voltages of the word lines in the block ramp up to a pass voltage, the voltage of the channel of the memory string that is not selected for programming can increase due to the coupling effect from the increased voltages of the word lines. The voltage increase of the channel of the other memory string can lead to an increase of the voltage of the select gate line coupled to the select gate transistor. Furthermore, the voltage increase of the dummy word line next to the select gate line can also lead to an increase of the voltage of the select gate line, due to the coupling effect from the increased voltage of the dummy word line. The voltage increase of the select gate line can turn the select gate transistor connected to the select gate line and in the other memory string that is not selected for programming from an off state to an on state. Consequently the channel of the other memory string that is not selected for programming can have current leakage through the inhibit bit line connected to the other memory string. This current leakage can lead to a voltage decrease of the channel of the other memory string, and therefore the memory cell in the other memory string and also connected to a word line selected for programming can have program operation due to the voltage decrease of its channel, thus leading to the issue of program disturb.

In some cases, the voltage ramp can be performed in multiple stages. For example, the voltage of the select gate line coupled to the select gate transistor can first be ramped up to an intermediate voltage that is less than the target voltage, before the voltages of the word lines, including dummy word lines, in the block ramp up. Then the voltage of the select gate line can have a second ramp up to the target voltage when the voltages of the word lines in the block ramp up. With this two-step voltage increase for the select gate line, the voltage increase of the select gate line due to the increase in voltages in dummy word lines coupled to dummy memory cells adjacent to the select gate transistor can be reduced or avoided. This can further prevent the voltage leakage in bit line coupled to the other memory string that is not being programmed, and therefore reducing the program disturb.

Figure 1:
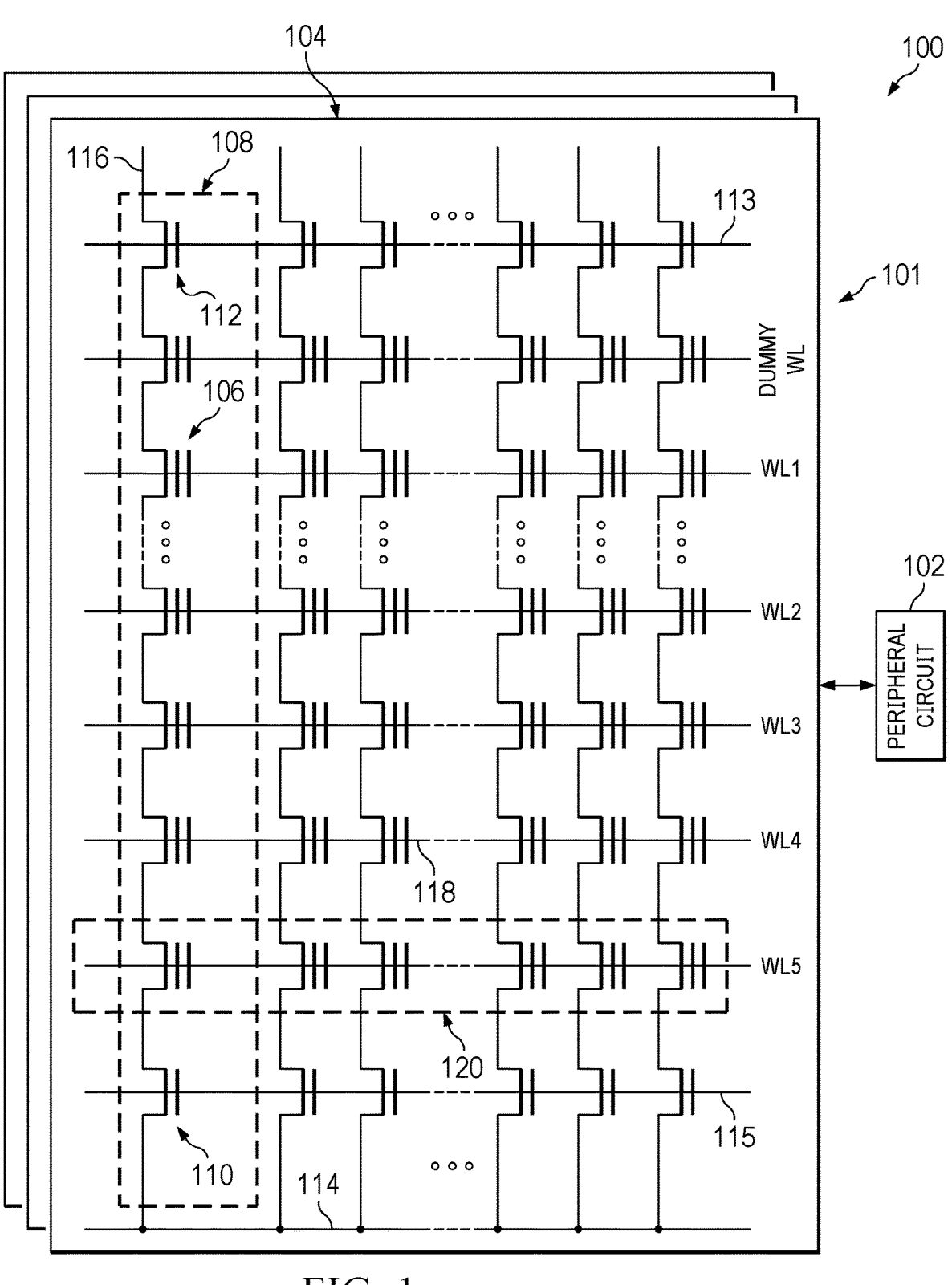
FIG. 1 illustrates an example of a schematic diagram of a memory device including peripheral circuits, according to some aspects of the present disclosure.

FIG. 1 illustrates an example of a schematic circuit diagram of a memory device 100 including peripheral circuits, according to some aspects of the present disclosure. Memory device 100 can include a memory cell array 101 and peripheral circuits 102 coupled to memory cell array 101. Memory cell array 101 can be a NAND Flash memory cell array in which memory cells 106 are provided in the form of an array of NAND memory strings 108 each extending vertically above a substrate (not shown). In some implementations, each NAND memory string 108 includes a plurality of memory cells 106 coupled in series and stacked vertically. Each memory cell 106 (e.g., first memory cell) can hold a continuous, analog value, such as an electrical voltage or charge that depends on the number of electrons trapped within a region of memory cell 106. Each memory cell 106 can be either a floating gate type of memory cell including a floating-gate transistor or a charge trap type of memory cell including a charge-trap transistor.

In some implementations, each memory cell 106 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 106 is a multi-level cell (MLC) that is capable of storing more than a single bit of data in more than four memory states. For example, the MLC can store two bits per cell, three bits per cell (also known as triple-level cell (TLC)), or four bits per cell (also known as quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 1 each NAND memory string 108 can include a source select gate (SSG) 110 at its source end and a drain select gate (DSG) 112 at its drain end. SSG 110 and DSG 112 can be configured to activate selected NAND memory strings 108 (columns of the array) during read and program operations. In some implementations, the sources of NAND memory strings 108 in the same block 104 are coupled through a same source line (SL) 114, e.g., a common SL. In other words, all NAND memory strings 108 in the same block 104 have an array common source (ACS), according to some implementations. DSG 112 of each NAND memory string 108 is coupled to a respective bit line 116 from which data can be read or written via an output bus (not shown), according to some implementations. In some implementations, each NAND memory string 108 is configured to be selected or deselected by applying a select voltage (e.g., above the threshold voltage of the transistor having DSG 112) or a deselect voltage (e.g., 0 V) to respective DSG 112 through one or more DSG lines 113, and/or by applying a select voltage (e.g., above the threshold voltage of the transistor having SSG 110) or a deselect voltage (e.g., 0 V) to respective SSG 110 through one or more SSG lines 115.

As shown in FIG. 1, NAND memory strings 108 can be organized into multiple blocks 104, each of which can have a common source line 114, e.g., coupled to the ACS. In some implementations, each block 104 is the basic data unit for erase operations, i.e., all memory cells 106 on the same block 104 are erased at the same time. To erase memory cells 106 in a selected block 104, source lines 114 coupled to selected block 104 as well as unselected blocks 104 in the same plane as selected block 104 can be biased with an erase voltage (Vers), such as a high positive voltage (e.g., 20 V or more). In some examples, erase operation may be performed at a half-block level, a quarter-block level, or a level having any suitable number of blocks or any suitable fractions of a block. Memory cells 106 of adjacent NAND memory strings 108 can be coupled through word lines 118 that select which row of memory cells 106 is affected by read and program operations. In some implementations, memory cell 106 is a SLC, and each word line 118 is coupled to a page 120 of memory cells 106, which is the basic data unit for program operations. If memory cell 106 is a MLC, each word line 118 can correspond to two pages. If memory cell 106 is a TLC, each word line 118 can correspond to three pages. If memory cell 106 is a QLC, each word line 118 can correspond to four pages. The size of one page 120 in bits can relate to the number of NAND memory strings 108 coupled by word line 118 in one block 104. Each word line 118 can include a plurality of control gates (gate electrodes) at each memory cell 106 in respective page 120 and a gate line coupling the control gates. Example word lines shown in FIG. 1 include dummy WL, WL1, WL2, WL3, WL4, and WL5 that are between one or more DSG lines 113 and one or more SSG lines 115.

Figure 2:
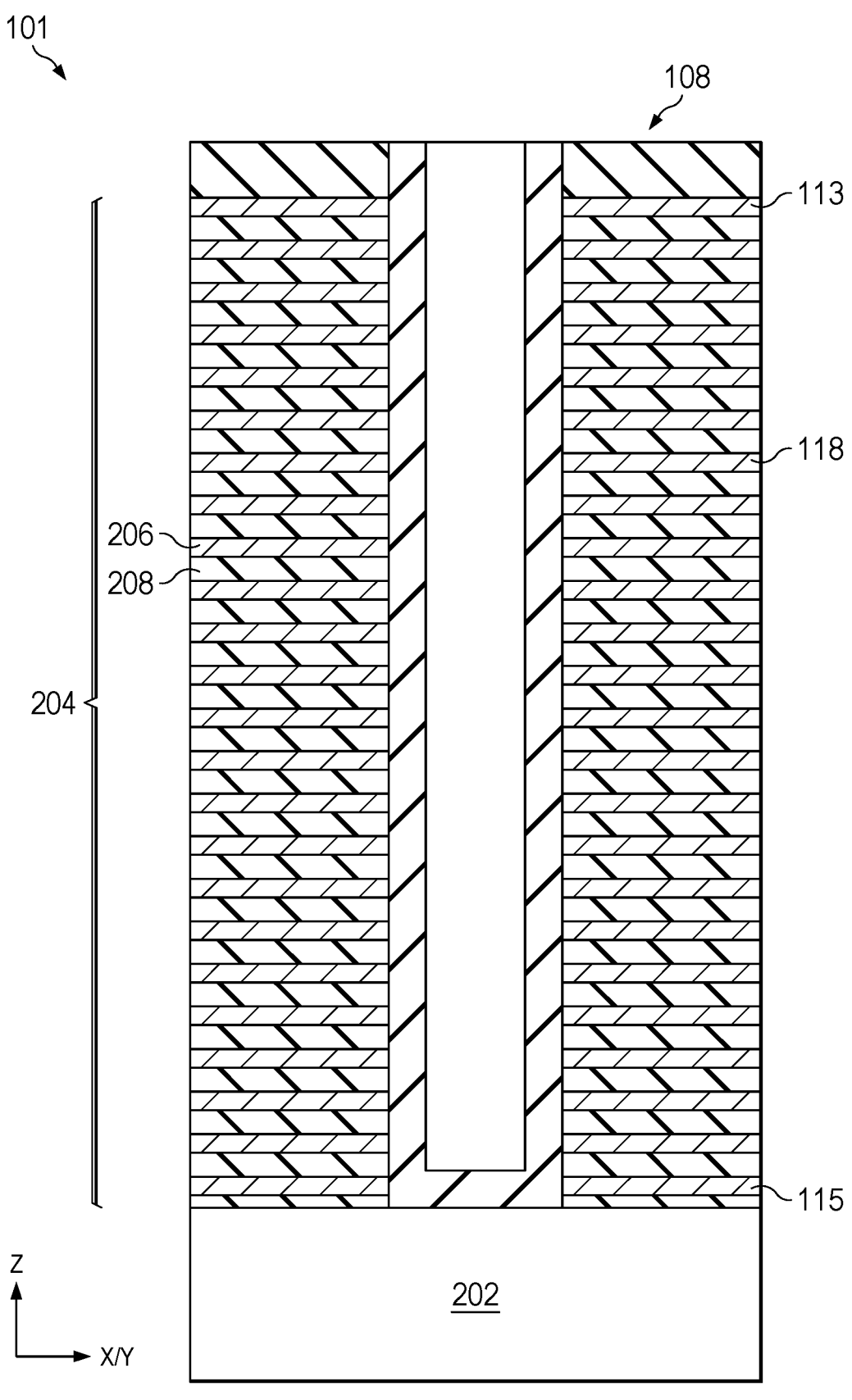
FIG. 2 illustrates an example of a side view of cross-sections of a memory cell array including NAND memory strings, according to some aspects of the present disclosure.

FIG. 2 illustrates an example of a side view of cross-sections of a memory cell array 101 including NAND memory strings 108, according to some aspects of the present disclosure. As shown in FIG. 2, NAND memory string 108 can extend vertically through a memory stack 204 above a substrate 202. Substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials.

Memory stack 204 can include interleaved gate conductive layers 206 and gate-to-gate dielectric layers 208. The number of the pairs of gate conductive layers 206 and gate-to-gate dielectric layers 208 in memory stack 204 can determine the number of memory cells 106 in memory cell array 101. Gate conductive layer 206 can include conductive materials including, but not limited to, tungsten (W), cobalt (Co), copper (Cu), aluminum (Al), polysilicon, doped silicon, silicides, or any combination thereof. In some implementations, each gate conductive layer 206 includes a metal layer, such as a tungsten layer. In some implementations, each gate conductive layer 206 includes a doped polysilicon layer. Each gate conductive layer 206 can include control gates surrounding memory cells 106, DSG 112, or SSG 110, and can extend laterally as DSG line 113 at the top of memory stack 204, SSG line 115 at the bottom of memory stack 204, or word line 118 between DSG line 113 and SSG line 115.

As shown in FIG. 1, consistent with the scope of the present disclosure, since a program operation is performed at the page/word line level for each block 104, each block 104 can be either an open block or a full block depending on whether all pages in respective block 104 have all been programmed. In some implementations, block 104 is an open block if at least one page 120 in block 104 is not programmed, i.e., memory cells 106 in at least one page 120 in block 104 are in the erased state. For example, an open block may include one or more unprogrammed pages. In some implementations, block 104 is a full block if all pages 120 in block 104 are programmed, i.e., memory cells 106 in all pages 120 in block 104 are in the programmed states. For example, a full block may not include any unprogrammed page.

Figure 3:
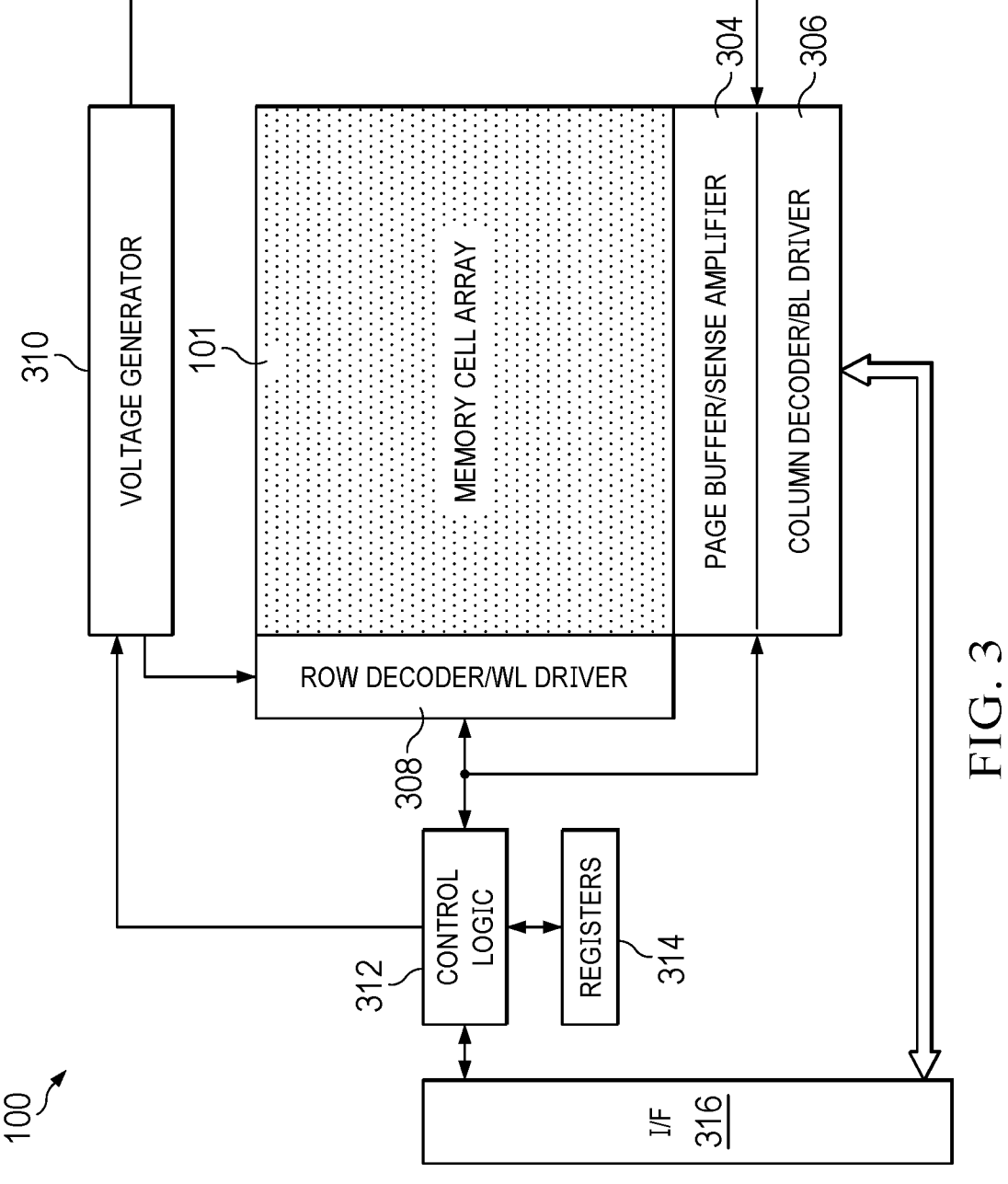
FIG. 3 illustrates some example peripheral circuits, according to some aspects of the present disclosure.

Peripheral circuits 102 can be coupled to memory cell array 101 through bit lines 116, word lines 118, source lines 114, SSG lines 115, and DSG lines 113. Peripheral circuits 102 can include any suitable analog, digital, and mixed-signal circuits for facilitating the operations of memory cell array 101 by applying and sensing voltage signals and/or current signals to and from each target memory cell 106 through bit lines 116, word lines 118, source lines 114, SSG lines 115, and DSG lines 113. Peripheral circuits 102 can include various types of peripheral circuits formed using metal-oxide-semiconductor (MOS) technologies. For example, FIG. 3 illustrates some example peripheral circuits, according to some aspects of the present disclosure. The example peripheral circuits include a page buffer/sense amplifier 304, a column decoder/bit line driver 306, a row decoder/word line driver 308, a voltage generator 310, control logic 312, registers 314, an interface 316, and a data bus. In some examples, additional peripheral circuits not shown in FIG. 3 may be included as well.

Page buffer/sense amplifier 304 can be configured to read and program (write) data from and to memory cell array 101 according to the control signals from control logic 312. In one example, page buffer/sense amplifier 304 may store one page of program data (write data) to be programmed into one page 120 of memory cell array 101. In another example, page buffer/sense amplifier 304 may perform program verify operations to ensure that the data has been properly programmed into memory cells 106 coupled to selected word lines 118. In still another example, page buffer/sense amplifier 304 may also sense the low power signals from bit line 116 that represents a data bit stored in memory cell 106 and amplify the small voltage swing to recognizable logic levels in a read operation. Column decoder/bit line driver 306 can be configured to be controlled by control logic 312 and select one or more NAND memory strings 108 by applying bit line voltages generated from voltage generator 310.

Row decoder/word line driver 308 can be configured to be controlled by control logic 312 and select/deselect blocks 104 of memory cell array 101 and select/deselect word lines 118 of block 104. Row decoder/word line driver 308 can be further configured to drive word lines 118 using word line voltages generated from voltage generator 310. In some implementations, row decoder/word line driver 308 can also select/deselect and drive SSG lines 115 and DSG lines 113 as well. As described below in detail, row decoder/word line driver 308 is configured to apply a read voltage to selected word line 118 in a read operation on memory cell 106 coupled to selected word line 118.

Voltage generator 310 can be configured to be controlled by control logic 312 and generate the word line voltages (e.g., read voltage, program voltage, pass voltage, local voltage, verification voltage, etc.), bit line voltages, and source line voltages to be supplied to memory cell array 101.

Control logic 312 can be coupled to each peripheral circuit described above and configured to control operations of each peripheral circuit. Registers 314 can be coupled to control logic 312 and include status registers, command registers, and address registers for storing status information, command operation codes (OP codes), and command addresses for controlling the operations of each peripheral circuit. As described below in detail, the status registers of registers 314 can include one or more registers configured to store open block information indicative of the open block(s) of all blocks 104 in memory cell array 101, such as having an ADSV list. In some implementations, the open block information is also indicative of the last programmed page of each open block.

Interface 316 can be coupled to control logic 312 and act as a control buffer to buffer and relay control commands received from a host (not shown) to control logic 312 and status information received from control logic 312 to the host. Interface 316 can also be coupled to column decoder/bit line driver 306 via a data bus and act as a data input/output (I/O) interface and a data buffer to buffer and relay the data to and from memory cell array 101.

Figure 4A:
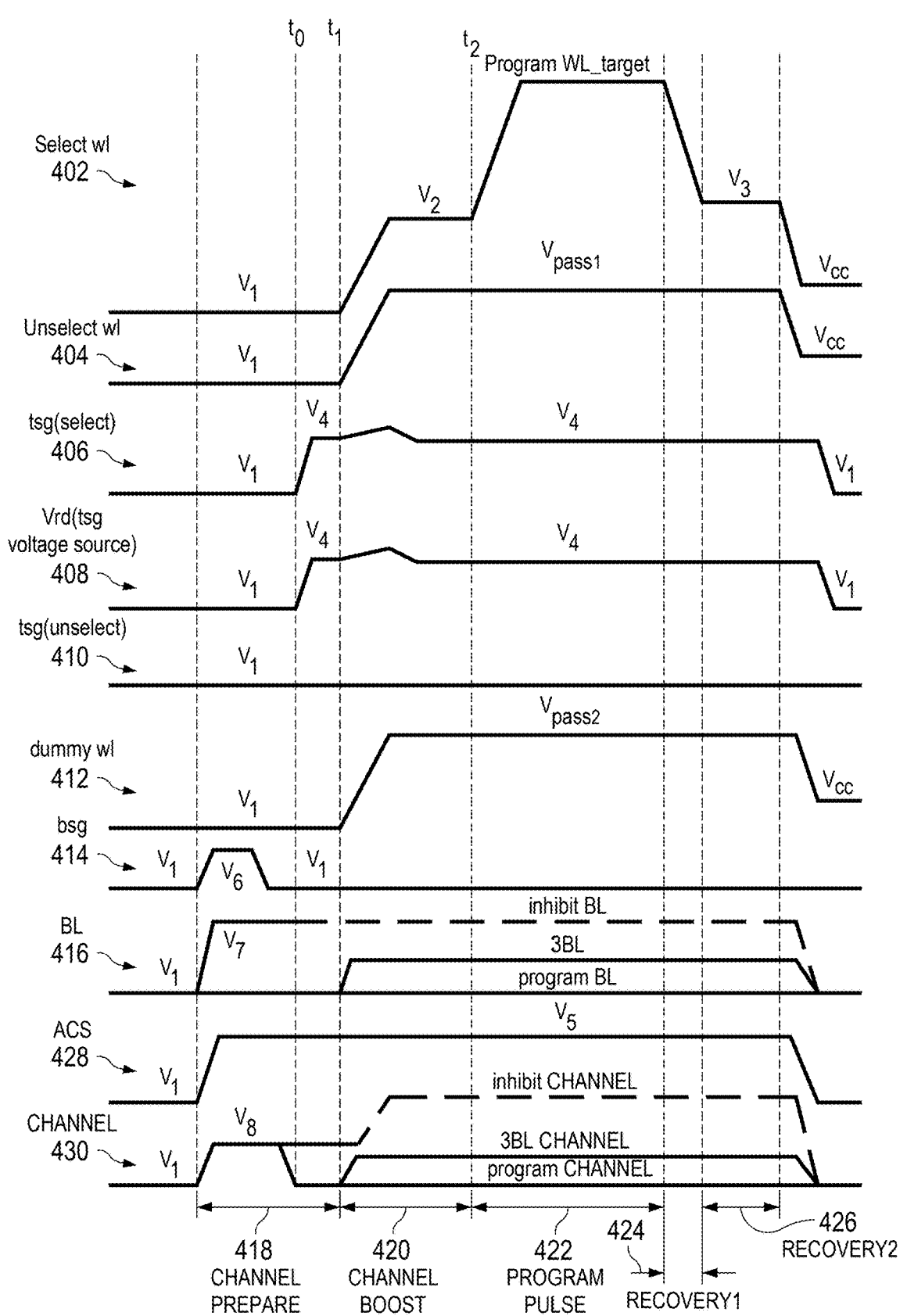
FIG. 4A illustrates an example of voltages of components in a memory cell block during programming of the memory cell block, according to some aspects of the present disclosure.
Figure 9:
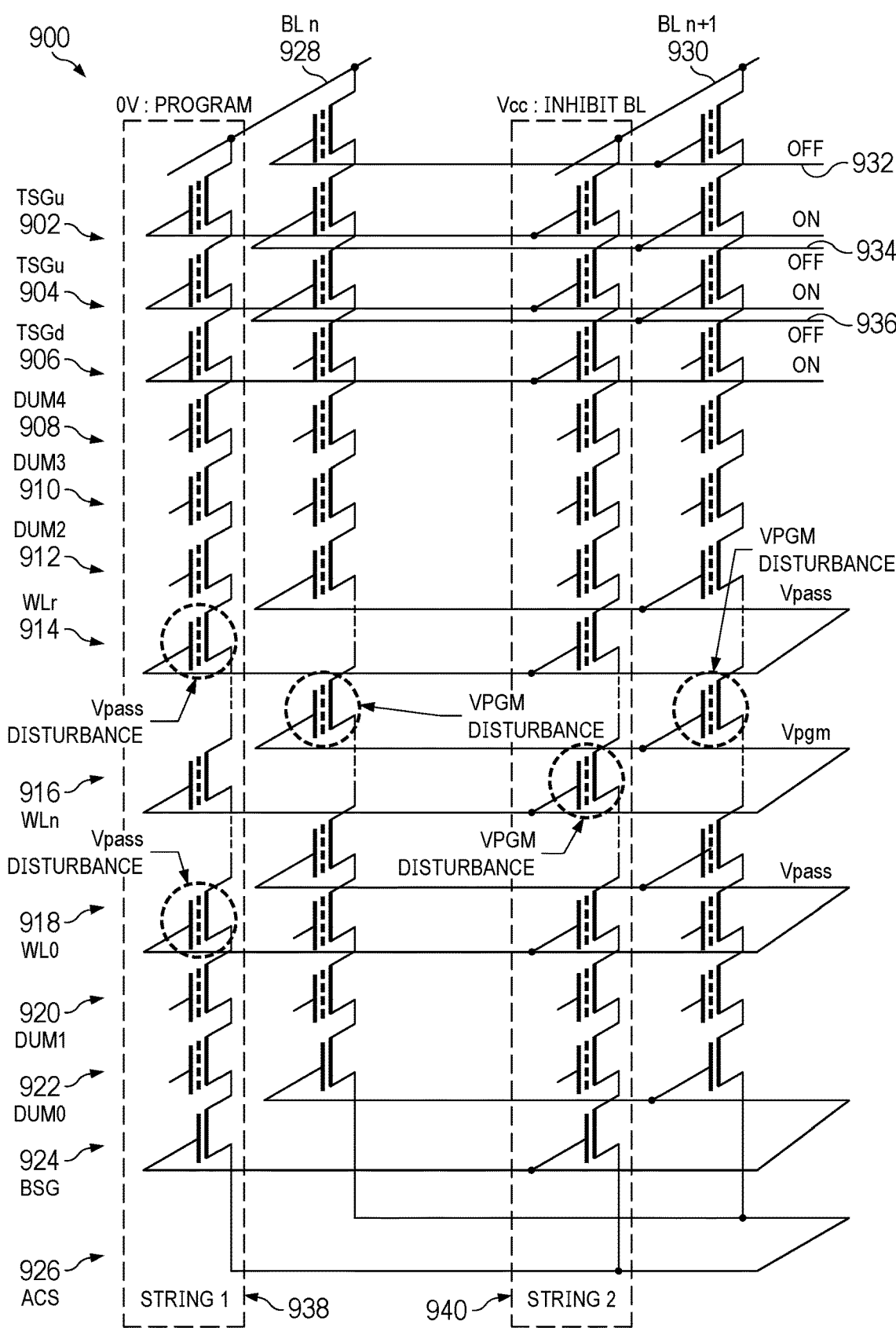
FIG. 9 illustrates an example of a schematic diagram of a memory cell array, according to some aspects of the present disclosure.

FIG. 4A illustrates an example of voltages of components in a memory cell array during programming of a memory cell block in the memory cell array, according to some aspects of the present disclosure. In some implementations, select w1 402 represents a word line selected for a program operation. Select w1 402 can be an example of word line 118 in FIG. 1. Unselect w1 404 represents a word line not selected for programming. Unselect w1 404 can also be an example of word line 118 in FIG. 1. Tsg(select) 406 represents a select gate line, for example, DSG line 113, coupled to one or more select gate transistors, for example, DSG 112 (e.g., first select gate transistor) in FIG. 1, in the memory cell block. Vrd 408 is the output voltage from the power source of tsg(select) 406. Tsg(unselect) 410 represents a select gate line that is turned off, for example, the select gate lines 932, 934, and 936 that are turned off in FIG. 9. FIG. 9 illustrates an example 900 of a schematic diagram of a memory cell array, according to some aspects of the present disclosure. Dummy w1 412 represents a dummy word line in the memory cell block. Bsg 414 represents a bottom select gate line, for example, SSG line 115, that is coupled to one or more select gate transistors, for example, SSG 110 (e.g., source select gate transistor) in FIG. 1, in the memory cell block. BL 416 represents a bit line in the memory cell block, for example, bit line 116 in FIG. 1. BL 416 can represent one of three types of bit line: a program bit line representing a bit line of a memory string selected for a program operation, for example, the program BL in FIG. 4A, a bit line with intermediate voltage, for example, 3BL in FIG. 4A, and an inhibit bit line representing a bit line of a memory string not selected for a program operation, for example, inhibit BL in FIG. 4A. ACS 428 represents a source line, for example, source line 114 in FIG. 1, connected to all memory strings in the memory cell block.

In some implementations, the voltages of Vrd 408 and tsg(select) 406 start to increase from $V_1$ to $V_4$ at to during the period of channel prepare 418. An example value of $V_1$ is 0V, and an example value of $V_4$ is 3V. At $t_1$ (e.g., third time), the beginning of the period of channel boost 420, the voltage of select w1 402 starts to increase from $V_1$ to $V_2$ (e.g., third voltage), the voltage of unselect w1 404 (e.g., second word line) starts to increase from $V_1$ to a pass voltage $V_{pass1}$ (e.g., fifth voltage), and the voltage of dummy w1 412 (e.g., dummy word line) starts to increase from $V_1$ to a pass voltage $V_{pass2}$ (e.g., fifth voltage). In some implementations, when a specific voltage is applied to a line at a specific time, due to the loading effect associated with the line, it may take some time for the voltage of the line to reach that specific voltage. For example, when $V_2$ is applied to select w1 402 at $t_1$, it may take some time for the voltage of select w1 402 to increase from $V_1$ to $V_2$, as shown in FIG. 4A. In some other implementations, the voltage of the line can reach the applied specific voltage instantly at the specific time. An example value of $V_2$ is 6.5V. In some implementations, $V_2$ can be larger than $V_{pass1}$ or $V_{pass2}$. $V_{pass1}$ and $V_{pass2}$ can be the same in some cases. Examples of different word lines are also shown in FIG. 9. WLn 916 in FIG. 9 corresponds to select w1 402. WL0 918 and WLr 914 correspond to unselect w1 404. DUM0 922 to DUM4 908 correspond to dummy w1 412.

In some implementations, when the voltages of word lines 402, 404, and 412 start to increase, the voltage of the channel of a memory string that is not selected for programming, for example, the voltage of the inhibit channel in channel 430, can increase due to the coupling effect from the increased voltages of the word lines. An example of a memory string that is not selected for programming is memory string 940 in FIG. 9, which is connected to bit line 930. The voltage increase of the channel of the memory string that is not selected for programming can lead to an increase of the voltage of a select gate line, for example, tsg(select) 406 in FIG. 4A or TSGd 906 in FIG. 9, during the period of channel boost 420. In some implementations, the voltages of select gate lines TSGu 902, TSGu 904, and TSGd 906 in FIG. 9 can be the same. In some other implementations, the voltages of TSGu 902, TSGu 904, and TSGd 906 can be different. Furthermore, the voltage increase of a dummy word line next to the select gate line, for example, dummy w1 412 in FIG. 4A or dummy word line 908 next to TSGd 906 in FIG. 9, can also lead to an increase of the voltage of the select gate line, due to the coupling effect from the voltage increase of the dummy word line. The voltage increase of the select gate line can turn the select gate transistor connected to the select gate line and in the other memory string that is not selected for programming, for example, the select gate transistor connected to TSGd 906 and in memory string 940, from an off state to an on state. Consequently the channel of the other memory string that is not selected for programming, for example, the channel of memory string 940, can have current leakage through the inhibit bit line connected to the other memory string. This current leakage can lead to a voltage decrease of the channel of the other memory string, and therefore the memory cell in the other memory string and also connected to a word line selected for programming, for example, the memory cell in memory string 940 and also connected to word line WLn 916, can have program operation due to the voltage decrease of its channel, thus leading to the issue of program disturb.

In some implementations, the voltage of inhibit BL is increased from $V_1$ to $V_7$ (ninth voltage) at the beginning of the period of channel prepare 418 to prepare for the program operation. The voltage of program BL stays at $V_1$ from the beginning of the channel prepare 418 to the end of recovery2 426. The voltage of 3BL in BL 416 can couple up to an intermediate voltage from $V_1$ at the beginning of channel boost 420 and can decrease from the intermediate voltage to $V_1$ after the end of recovery2 426.

In some implementations, the voltage of channel 430, for example, the respective voltages of inhibit channel, 3BL channel, and program channel, can change in respond to voltage changes in bsg 414, BL 416, and ACS 428. For example, the voltage changes in ACS 428 and bsg 414 for channel pre-charging during the period of channel prepare 418 can lead to voltage change of channel 430 during the period of channel prepare 418, as a result of channel pre-charging. More specifically, the voltages of inhibit channel, 3BL channel, and program channel can start to increase from $V_1$ to $V_8$ at the beginning of the period of channel prepare 418, and ramp down to $V_1$ at or before $t_0$. The voltage of channel 430 after $t_1$ can result from the voltage applied to BL 416.

In some implementations, the programming of a memory cell in a memory string in block 104 involves a program operation from the top to the bottom of block 104. For example, referring to FIG. 2, the order of the program operation from the top to the bottom is from the memory cell coupled to the word line further away from substrate 202 to the memory cell coupled to the word line close to substrate 202. In order to pre-charge the channel of the memory string selected for programming and the channel of the memory string not selected for programming, the voltage of ACS 428 starts to increase from $V_1$ to $V_5$ (e.g., eighth voltage) at the beginning of the period of channel prepare 418 and before $t_0$. An example value of $V_5$ is 2V. Furthermore, a voltage $V_6$ (e.g., sixth voltage) can be applied to bsg 414 (e.g., second select line) during the period of channel prepare 418 for pre-charging the channel of the memory string selected for programming and the channel of the memory string not selected for programming. $V_6$ can be applied to turn on transistors coupled to bsg 414, for example, SSG 110 in FIG. 1, in order to connect the channels of the memory strings to ACS 428, for example, source line 114 in FIG. 1. When pre-charging the channel of the memory string selected for programming and the channel of the memory string not selected for programming, the voltage of bsg 414 is first increased from $V_1$ to $V_6$, and then decreased from $V_6$ to $V_1$ (e.g., seventh voltage) before $t_1$. $V_6$ can be larger than $V_4$. An example value of $V_6$ is 5V.

In some implementations, the voltage of tsg(unselect) 410 stays at $V_1$ during the program operation. An example value of $V_1$ is 0V.

In some implementations, starting from the beginning of the period of recovery1 424, the voltage of select w1 402 goes from the programming voltage program_w1_target to $V_3$. An example value of $V_3$ is 8V. Starting from the end of the period of recovery2 426, the voltages of select w1 402 and unselect w1 404 go from $V_3$ and a pass voltage $V_{pass1}$ respectively to a voltage $V_{cc}$ that is lower than $V_3$ and $V_{pass1}$.

In some implementations, the voltage of select w1 402 starts to increase from $V_2$ to the programming voltage program_w1_target (e.g., fourth voltage) at $t_2$ (e.g., fourth time), the beginning of the period of program pulse 422. Starting from the beginning of the period of the first recovery, i.e., recovery1 424, the voltage of select w1 402 goes from the programming voltage program_w1_target to $V_3$. Starting from the end of the period of second recovery, i.e., recovery2 426, the voltages of select w1 402 and unselect w1 404 go from $V_3$ and $V_{pass1}$ respectively to a power supply voltage $V_{cc}$.

In some implementations, after the end of the period of recovery2 426, the voltages of tsg(select) 406 and Vrd 408 decrease from $V_4$ to $V_1$ respectively, the voltage of dummy w1 412 decreases from $V_{pass2}$ to $V_{cc}$, the voltage of inhibit BL decreases from $V_7$ to $V_1$, the voltage of 3BL in BL 416 decreases from the intermediate voltage to $V_1$, and the voltage of ACS 428 decreases from $V_5$ to $V_1$.

In some implementations, the voltages shown in FIG. 4A can represent the voltages during ISPP pulses that occur in a later portion of ISPP. For example, for ISPP with 16 program pulses, the last 10 pulses can have the voltages shown in FIG. 4A. These last 10 pulses can have higher voltages than the voltages of the first 6 pulses and can lead to larger disturb during the program operation. Therefore channel pre-charge can be applied to the last 10 pulses. In contrast, the disturb due to the first 6 pulses can be small because of the smaller voltages of the first 6 pulses when compared to the voltages of the last 10 pulses, and therefore channel pre-charge is not applied to the first 6 pulses.

Figure 10:
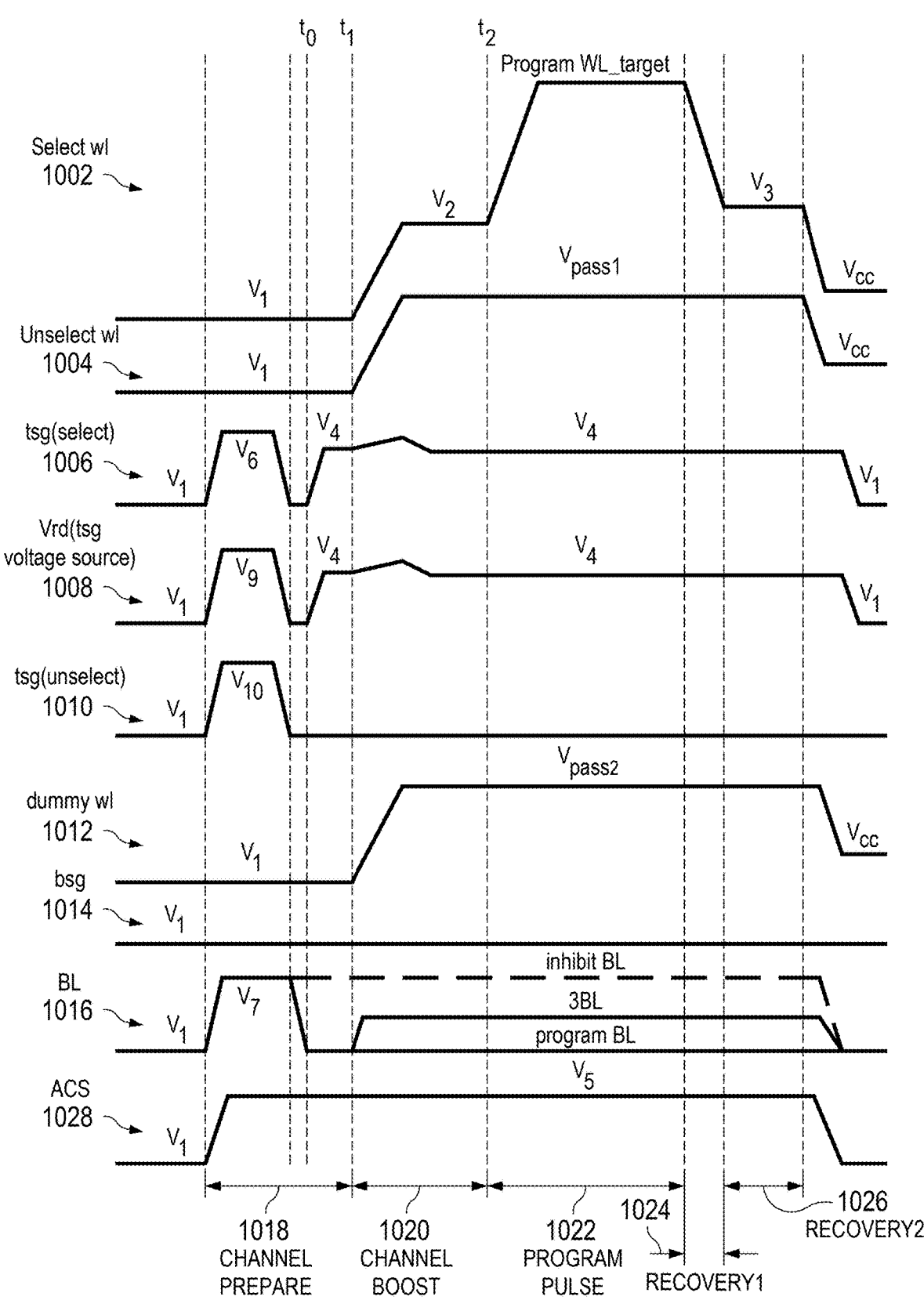
FIG. 10 illustrates an example of voltages of components in a memory cell block during programming from the bottom to the top of the memory cell block, according to some aspects of the present disclosure.

In some implementations, the programming of a memory cell in a memory string in block 104 involves a program operation from the bottom to the top of block 104. For example, referring to FIG. 2, the order of the program operation from the bottom to the top is from the memory cell coupled to the word line close to substrate 202 to the memory cell coupled to the word line further away from substrate 202. FIG. 10 illustrates an example of voltages of components in a memory cell block during programming from the bottom to the top of the memory cell block, according to some aspects of the present disclosure. As shown in FIG. 10, the voltages of tsg(select) 1006, Vrd 1008, tsg(unselect) 1010, bsg 1014, and BL 1016, during the period of channel prepare 1018, can be different than the respective voltages shown in FIG. 4A for the case of program operation from the top to the bottom. In order to pre-charge the channel of the memory string selected for programming and the channel of the memory string not selected for programming, the voltage of BL 1016 starts to increase from $V_1$ to a higher voltage at the beginning of the period of channel prepare 1018 and before $t_0$. Furthermore, a voltage can be applied to tsg(select) 1006 and tsg(unselect) 1010 during the period of channel prepare 1018 for pre-charging the channel of the memory string selected for programming and the channel of the memory string not selected for programming. This voltage can be applied to turn on transistors coupled to tsg(select) 1006 and transistors coupled to tsg(unselect) 1010, for example, DSG 112 in FIG. 1, in order to connect the channels of the memory strings to BL 1016, for example, bit line 116 in FIG. 1. When pre-charging the channel of the memory string selected for programming and the channel of the memory string not selected for programming, the voltage of tsg(select) 1006 is first increased from $V_1$ to a voltage that can turn on transistors coupled to tsg(select) 1006, and then decreased from that voltage to $V_1$ before $t_0$; the voltage of tsg(unselect) 1010 is first increased from $V_1$ to a voltage that can turn on transistors coupled to tsg(unselect) 1010, and then decreased from that voltage to $V_1$ before $t_0$. The voltage of bsg 1014 stays at $V_1$ during the program operation from the bottom to the top of block 104. The voltages of tsg(select) 1006, Vrd 1008, tsg(unselect) 1010, bsg 1014, and BL 1016 for the case of a program operation from the bottom to the top of block 104 are illustrated in FIG. 10.

Figure 4B:
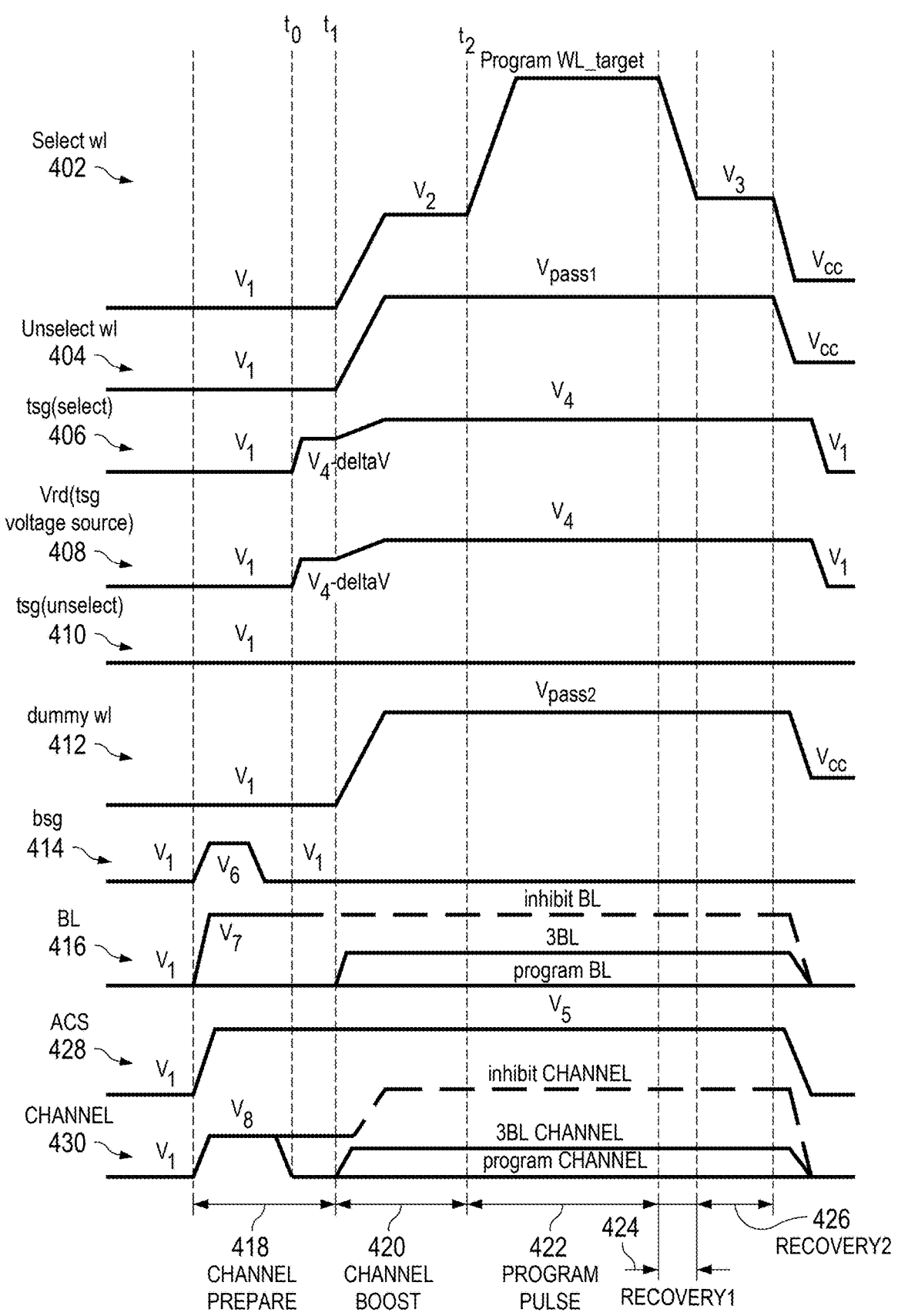
FIG. 4B illustrates another example of voltages of components in a memory cell block during programming of the memory cell block, according to some aspects of the present disclosure.

FIG. 4B illustrates another example of voltages of components in a memory cell block during programming of the memory cell block, according to some aspects of the present disclosure. Voltage conditions of most components of the memory cell block, for example, select w1 402, unselect w1 404, tsg(unselect) 410, dummy w1 412, bsg 414, BL 416, and ACS 428, are identical to those in FIG. 4A, except for tsg(select) 406 and Vrd 408.

In some implementations, as shown in FIG. 4A, for the voltage of tsg(select) 406 and during the period of channel boost 420, there is a voltage ramp up and voltage ramp down. This voltage ramp up and ramp down can cause current leakage and therefore voltage decrease of the channel of a memory string that is not selected for programming. The voltage decrease can start during the period of channel boost 420. To reduce this voltage leakage, a two-step voltage increase can be used in Vrd 408 and tsg(select) 406 of FIG. 4B. The first increase of voltage of tsg(select) 406 during the two-step voltage increase starts at to (e.g., first time) during the period of channel prepare 418, when the voltages of Vrd 408 and tsg(select) 406 (e.g., first select line) start to increase from $V_1$ to $V_4$-deltaV (e.g., first voltage). DeltaV is a preset voltage value that is larger than 0 V and smaller than $V_4$. This two-step voltage increase can be applied to both the case with program operation from the top to the bottom of a block (e.g., block 104) and the case with program operation from the bottom to the top of a block.

In some implementations, following the first increase of voltage of tsg(select) 406, the second increase of voltage of tsg(select) 406 can occur at $t_1$ (e.g., second time) or at another time between to and $t_2$, when the voltages of Vrd 408 and tsg(select) 406 start to increase from $V_4$-deltaV to $V_4$ (e.g., second voltage). In some implementations, $V_4$-deltaV is applied to tsg(select) 406 to turn on the transistor coupled to tsg(select) 406. $t_1$ can be the beginning of the period of channel boost 420, the time when the voltage of select w1 402 (e.g., first word line) starts to increase from $V_1$ to $V_2$, or the time when the voltages of unselect w1 404 and dummy w1 412 start to increase from $V_1$ to a pass voltage $V_{pass2}$. In some implementations, this two-step voltage increase of Vrd 408 and tsg(select) 406 can reduce the voltage leakage of the inhibit BL in BL 416 that starts during the period of channel boost 420.

In some implementations, $t_1$ can be a time earlier than the time when the voltage of select w1 402 starts to increase from $V_1$ to $V_2$.

Figure 5:
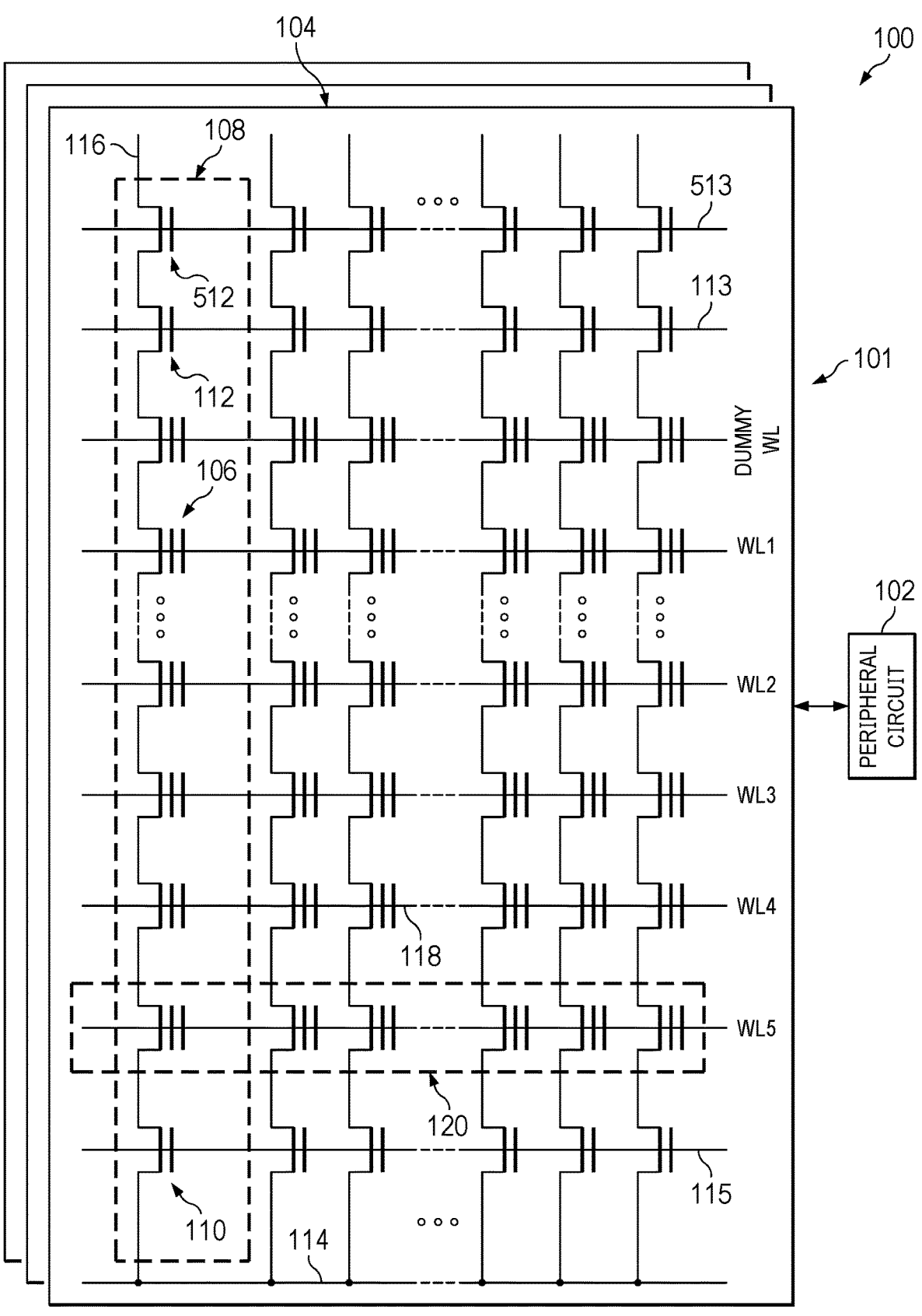
FIG. 5 illustrates another example of a schematic diagram of a memory device including peripheral circuits, according to some aspects of the present disclosure.

In some implementations, block 104 can also include a second select gate transistor coupled to a second DSG line that is different than a first DSG line coupled to tsg(select) 406. As shown in FIG. 5, which illustrates another example of a schematic diagram of a memory device including peripheral circuits, according to some aspects of the present disclosure, the second DSG line 513 coupled to a second select gate transistor DSG 512 (e.g., second select gate transistor) is above the first DSG line 113 that is coupled to a first select gate transistor DSG 112 (e.g., first select gate transistor). Both the first and the second DSG lines are positioned above all the word lines in block 104, and the first DSG line 113 is closer to all the word lines in block 104 than the second DSG line 513. When memory string 108 has both the first DSG 112 and the second DSG 512, the voltage of the first DSG line 113 can start to increase at to from $V_1$ to $V_4$-deltaV or from $V_1$ to a voltage different than $V_4$-deltaV. In some implementations, if there are two or more DSGs in a memory string, the two-step voltage increase can be applied to at least the DSG line that is closest to all the word lines in block 104.

Figure 4C:
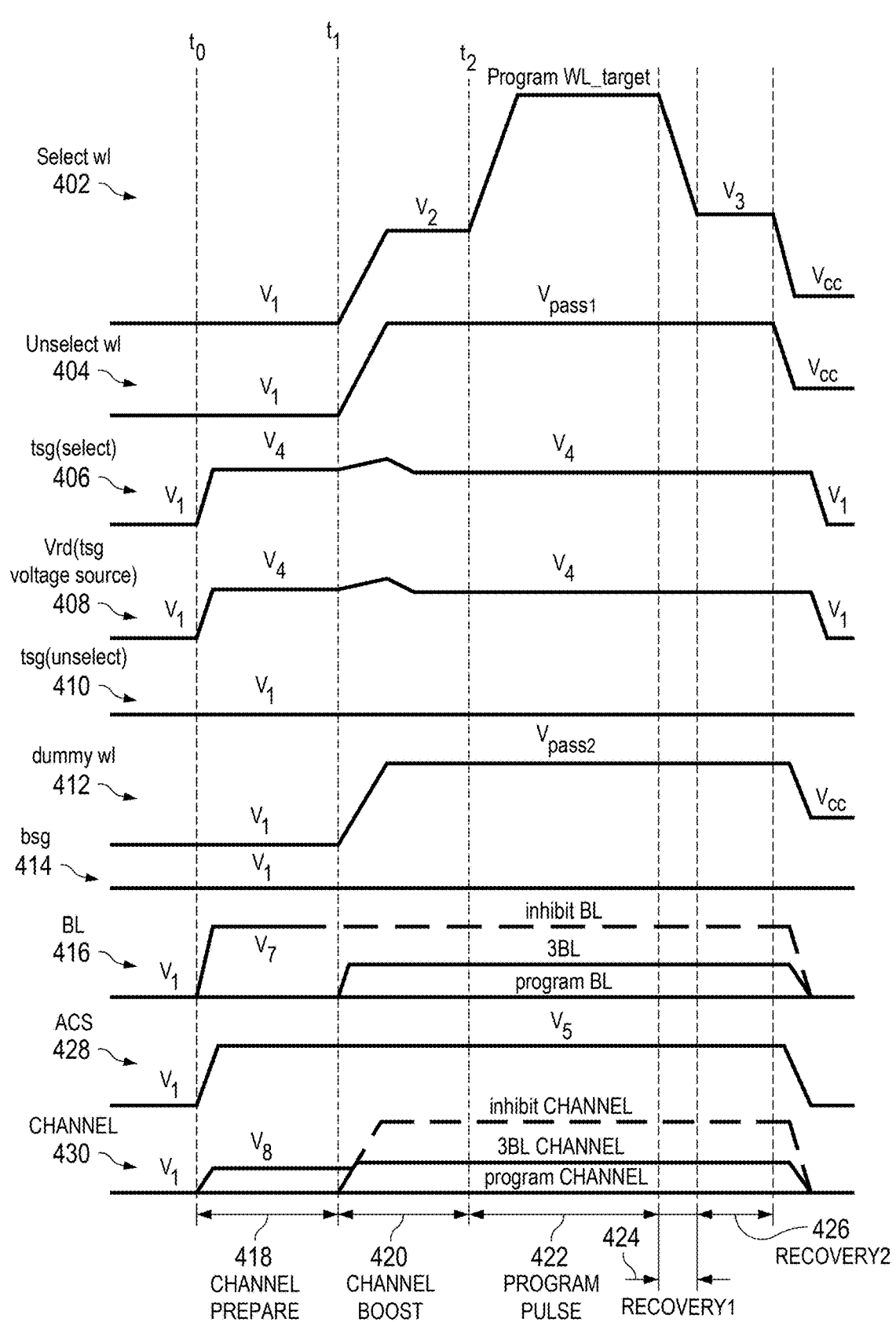
FIG. 4C illustrates another example of voltages of components in a memory cell block during programming of the memory cell block, according to some aspects of the present disclosure.

FIG. 4C illustrates another example of voltages of components in a memory cell block during programming of the memory cell block, according to some aspects of the present disclosure. Voltage conditions of most components of the memory cell block, for example, select w1 402, unselect w1 404, tsg(unselect) 410, dummy w1 412, BL 416, and ACS 428, are identical to those in FIG. 4A, except for tsg(select) 406, Vrd 408, and bsg 414. Channel pre-charge is not performed in FIG. 4C.

In some implementations, the time to when the voltages of Vrd 408 and tsg(select) 406 in FIG. 4C start to increase from $V_1$ to $V_4$ can be at the beginning of the period of channel prepare 418, instead of during the period of channel prepare 418 that is shown in the voltages of Vrd 408 and tsg(select) 406 in FIG. 4A. The voltage of bsg 414 in FIG. 4C can be $V_1$ from the beginning of channel prepare 418 to the end of recovery2 426, without pre-charging the channel of the memory string selected for programming and the channel of the memory string not selected for programming, during the period of channel prepare 418 shown in FIG. 4A.

In some implementations, the voltages shown in FIG. 4C can represent the voltages during ISPP pulses that occur in an earlier portion of ISPP. For example, for ISPP with 16 program pulses, the first 6 pulses can have the voltages shown in FIG. 4C. These first 6 pulses can have lower voltages than the voltages of the last 10 pulses and can lead to small disturb during the program operation. Therefore channel pre-charge is not applied to the first 6 pulses. In contrast, the disturb due to the last 10 pulses can be large because of the large voltages of the last 10 pulses when compared to the voltages of the first 6 pulses, and therefore channel pre-charge is applied to the last 10 pulses, which corresponds to the cases described in FIGS. 4A and 4B.

Figure 4D:
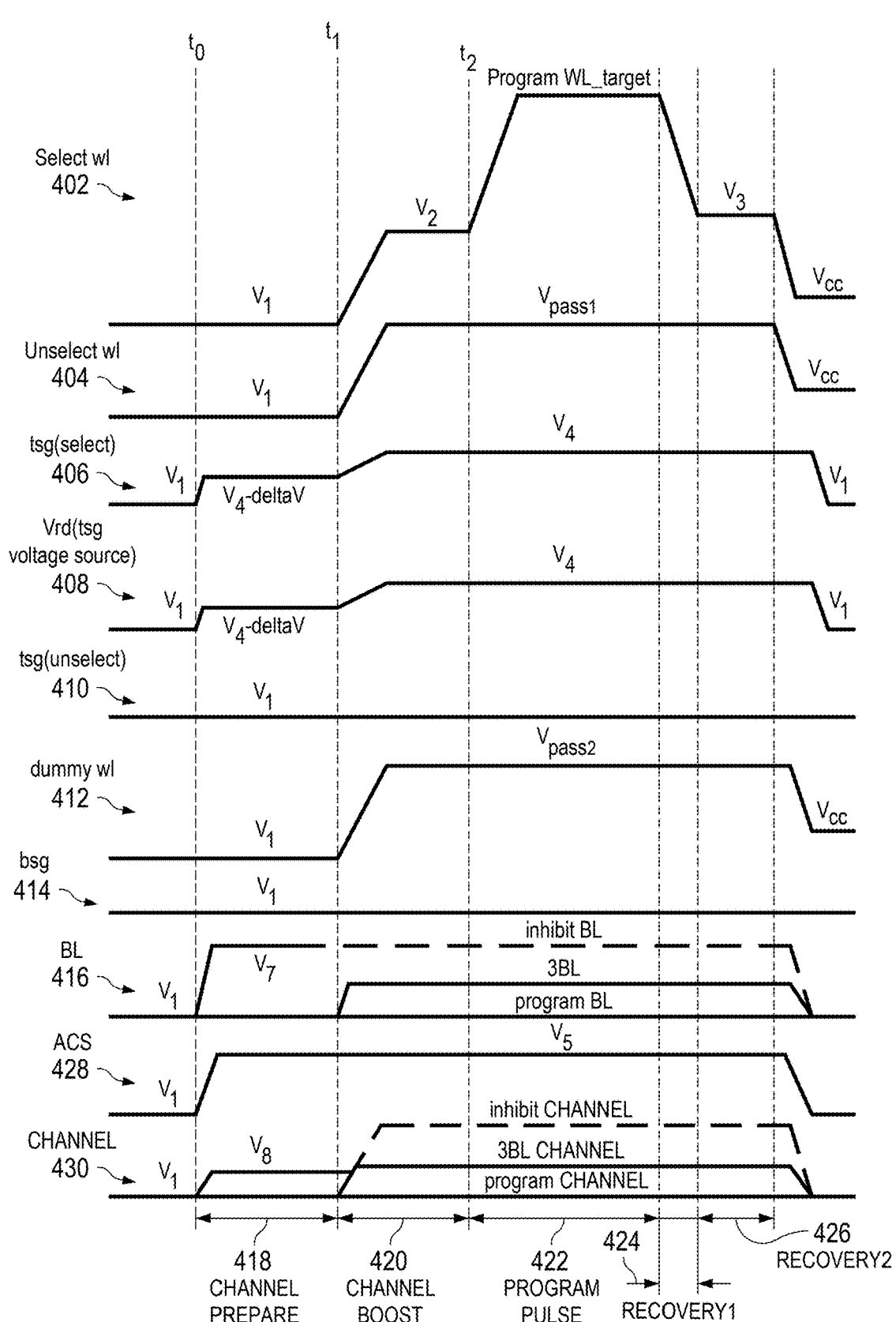
FIG. 4D illustrates another example of voltages of components in a memory cell block during programming of the memory cell block, according to some aspects of the present disclosure.

FIG. 4D illustrates another example of voltages of components in a memory cell block during programming of the memory cell block, according to some aspects of the present disclosure. Voltage conditions of most components of the memory cell block, for example, select w1 402, unselect w1 404, tsg(unselect) 410, dummy w1 412, bsg 414, BL 416, and ACS 428, are identical to those in FIG. 4C, except for tsg(select) 406 and Vrd 408. Similar to the case described in FIG. 4C, channel pre-charge is not performed in FIG. 4D.

In some implementations, as shown in FIG. 4C, for the voltage of tsg(select) 406, there is a voltage ramp up and ramp down during the period of channel boost 420. This voltage ramp up and ramp down can cause voltage leakage of the inhibit BL in BL 416 that starts during the period of channel boost 420. To reduce this voltage leakage of the inhibit BL, a two-step voltage increase can be used in Vrd 408 and tsg(select) 406 of FIG. 4B. The first voltage increase can start at to during the period of channel prepare 418, when the voltages of Vrd 408 and tsg(select) 406 start to increase from $V_1$ to $V_4$-deltaV. DeltaV can be a preset voltage value that is larger than 0 V.

In some implementations, following the first voltage increase, the second voltage increase occurs at $t_1$, when the voltages of Vrd 408 and tsg(select) 406 start to increase from $V_4$-deltaV to $V_4$. $t_1$ can be the beginning of the period of channel boost 420. $t_1$ can also be the time when the voltage of select w1 402 starts to increase from $V_1$ to $V_2$, and when the voltages of unselect w1 404 and dummy w1 412 start to increase from $V_1$ to a pass voltage $V_{pass2}$.

In some implementations, this two-step voltage increase of Vrd 408 and tsg(select) 406 can reduce the voltage leakage of the inhibit BL that starts during the period of channel boost 420.

In some implementations, block 104 can also include a second select gate transistor coupled to a second DSG line that is different than a first DSG line coupled to tsg(select) 406. Both the first and the second DSG lines are positioned above all the word lines in block 104, and the first DSG line is closer to all the word lines in block 104 than the second DSG line. The voltage of the second DSG line can start to increase at to from $V_1$ to $V_4$-deltaV or from $V_1$ to a voltage different than $V_4$-deltaV.

In some implementations, because channel pre-charge is not performed for cases associated with FIGS. 4C and 4D, FIGS. 4C and 4D can be applied to both the program operation from the bottom to the top of a block and the program operation from the top to the bottom of a block.

FIG. 6 illustrates an example of a flow chart of a method for reducing program disturb in a memory device, according to some aspects of the present disclosure. At 602, a first voltage is applied at a first time to a first select line coupled to a first select gate transistor of the memory device, where the memory device includes a memory cell array, the memory cell array includes a memory string, the memory string includes the first select gate transistor, multiple memory cells, and a source select gate transistor, the multiple memory cells are positioned between the first select gate transistor and the source select gate transistor, and the source select gate transistor is coupled to a source line of the memory cell array.

At 604, a second voltage is applied at a second time to the first select line coupled to the first select gate transistor, where the second time is after the first time, and the second voltage is larger than the first voltage.

At 606, a third voltage is applied at a third time to a first word line coupled to a first memory cell in the memory string, where the third time is after the first time, and the third voltage is larger than the second voltage.

At 608, a fourth voltage is applied at a fourth time to the first word line coupled to the first memory cell in the memory string, where the fourth time is after the second time, and the fourth voltage is a programming voltage for the first memory cell in the memory string.

Figure 7:
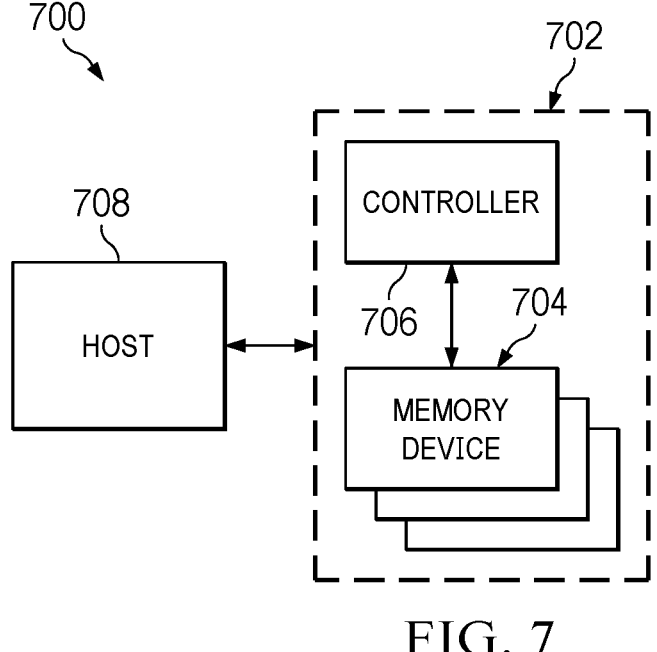
FIG. 7 illustrates a block diagram of an example system having a memory device, according to some aspects of the present disclosure.

FIG. 7 illustrates a block diagram of an example system 700 having a memory device, according to some aspects of the present disclosure. System 700 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 6, system 700 can include a host 708 and a memory system 702 having one or more memory devices 704 and a memory controller 706. Host 708 can be a processor of an electronic device, such as a central processing unit (CPU), or a system-on-chip (SoC), such as an application processor (AP). Host 708 can be configured to send or receive data to or from memory devices 704.

Memory device 704 can be any memory device disclosed in the present disclosure. Memory controller 706 is coupled to memory device 704 and host 708 and is configured to control memory device 704, according to some implementations. Memory controller 706 can manage the data stored in memory device 704 and communicate with host 708. In some implementations, memory controller 706 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 706 is designed for operating in a high duty-cycle environment SSDs or embedded multi-media-cards (eMMCs) used as data storage for mobile devices, such as smartphones, tablets, laptop computers, etc., and enterprise storage arrays. Memory controller 706 can be configured to control operations of memory device 704, such as read, erase, and program operations. Memory controller 706 can also be configured to manage various functions with respect to the data stored or to be stored in memory device 704 including, but not limited to bad-block management, garbage collection, logical-to-physical address conversion, wear leveling, etc. In some implementations, memory controller 706 is further configured to process error correction codes (ECCs) with respect to the data read from or written to memory device 704. Any other suitable functions may be performed by memory controller 706 as well, for example, formatting memory device 704.

Memory controller 706 can communicate with an external device (e.g., host 708) according to a particular communication protocol. For example, memory controller 706 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 8A:
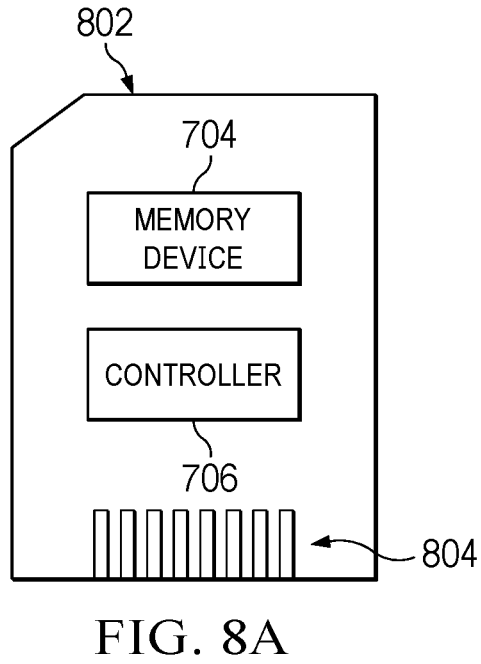
FIG. 8A illustrates a diagram of a memory card having a memory device, according to some aspects of the present disclosure.
Figure 8B:
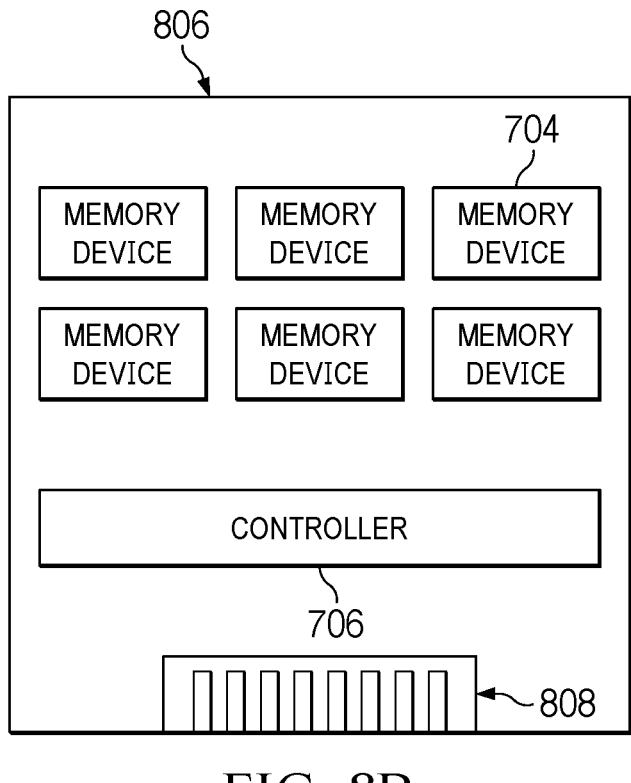
FIG. 8B illustrates a diagram of a solid-state drive (SSD) having a memory device, according to some aspects of the present disclosure.

Memory controller 706 and one or more memory devices 704 can be integrated into various types of storage devices, for example, be included in the same package, such as a universal Flash storage (UFS) package or an eMMC package. That is, memory system 702 can be implemented and packaged into different types of end electronic products. In one example as shown in FIG. 8A, memory controller 706 and a single memory device 704 may be integrated into a memory card 802. Memory card 802 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 802 can further include a memory card connector 804 coupling memory card 802 with a host (e.g., host 708 in FIG. 6). In another example as shown in FIG. 8B, memory controller 706 and multiple memory devices 704 may be integrated into an SSD 806. SSD 806 can further include an SSD connector 808 coupling SSD 806 with a host (e.g., host 708 in FIG. 6). In some implementations, the storage capacity and/or the operation speed of SSD 806 is greater than those of memory card 802.

Certain aspects of the subject matter described here can be implemented as a memory device. The memory device includes a memory cell array and a peripheral circuit. The memory cell array includes a memory string, where the memory string includes a first select gate transistor, multiple memory cells, and a source select gate transistor. The multiple memory cells are positioned between the first select gate transistor and the source select gate transistor, and the source select gate transistor is coupled to a source line of the memory cell array. The peripheral circuit is coupled to the memory cell array and configured to perform a program operation of a first memory cell in the memory string, where to perform the program operation, the peripheral circuit is configured to apply, at a first time, a first voltage to a first select line coupled to the first select gate transistor, and apply, at a second time, a second voltage to the first select line coupled to the first select gate transistor, where the second time is after the first time, and the second voltage is larger than the first voltage.

The memory device can include one or more of the following features.

In some implementations, the peripheral circuit is further configured to apply, at a third time, a third voltage to a first word line coupled to the first memory cell in the memory string, where the third time is after the first time, and the third voltage is larger than the second voltage.

In some implementations, a voltage of the first word line coupled to the first memory cell at the first time is smaller than the third voltage.

In some implementations, the third time is a same time as the second time.

In some implementations, the peripheral circuit is further configured to apply, at a fourth time, a fourth voltage to the first word line coupled to the first memory cell in the memory string, where the fourth time is after the second time, and the fourth voltage is a programming voltage for the first memory cell in the memory string.

In some implementations, the peripheral circuit is further configured to apply, from the second time to the fourth time, the second voltage to the first select line.

In some implementations, a voltage of the first select line coupled to the first select gate transistor is the second voltage during a time period when a voltage of the first word line coupled to the first memory cell in the memory string is the fourth voltage.

In some implementations, the peripheral circuit is further configured to apply, at the third time, a fifth voltage to a dummy word line coupled to a dummy memory cell in the memory string.

In some implementations, a voltage of the dummy word line coupled to the dummy memory cell in the memory string is the fifth voltage during a time period when a voltage of the first word line coupled to the first memory cell in the memory string is the fourth voltage.

In some implementations, the peripheral circuit is further configured to apply, at the third time, the fifth voltage to a second word line coupled to a second memory cell in the memory string.

In some implementations, a voltage of the second word line coupled to the second memory cell in the memory string is the fifth voltage during a time period when the voltage of the first word line coupled to the first memory cell in the memory string is the fourth voltage.

In some implementations, a voltage of the first select line coupled to the first select gate transistor reaches the second voltage before the fourth time.

In some implementations, the memory string further includes a second select gate transistor, and the first select gate transistor is closer to the multiple memory cells than the second select gate transistor.

In some implementations, the peripheral circuit is further configured to apply, before the first time, a sixth voltage to a second select line coupled to the source select gate transistor.

In some implementations, the peripheral circuit is further configured to apply, after the first time, a seventh voltage to the second select line coupled to the source select gate transistor, where the seventh voltage is smaller than the sixth voltage.

In some implementations, the peripheral circuit is further configured to apply, before the first time, an eighth voltage to an array common source (ACS) line coupled to the memory string, where the eighth voltage is larger than the seventh voltage and smaller than the sixth voltage.

In some implementations, the peripheral circuit is further configured to apply, at the first time, the eighth voltage to the ACS line coupled to the memory string.

In some implementations, the peripheral circuit is further configured to apply, before the first time, a ninth voltage to a bit line coupled to another memory string of the memory cell array, where the ninth voltage is larger than the seventh voltage.

Certain aspects of the subject matter described here can be implemented as a memory system. The memory system includes a memory device and a controller. The memory device includes a memory cell array and a peripheral circuit. The memory cell array includes a memory string, where the memory string includes a first select gate transistor, multiple memory cells, and a source select gate transistor. The multiple memory cells are positioned between the first select gate transistor and the source select gate transistor, and the source select gate transistor is coupled to a source line of the memory cell array. The peripheral circuit is coupled to the memory cell array and configured to perform a program operation of a first memory cell in the memory string, where to perform the program operation, the peripheral circuit is configured to apply, at a first time, a first voltage to a first select line coupled to the first select gate transistor, and apply, at a second time, a second voltage to the first select line coupled to the first select gate transistor, where the second time is after the first time, and the second voltage is larger than the first voltage. The controller is coupled to the memory device and configured to send a signal to the memory device to initiate the program operation.

The memory system can include one or more of the following features.

In some implementations, the peripheral circuit is further configured to apply, at a third time, a third voltage to a first word line coupled to the first memory cell in the memory string, where the third time is after the first time, and the third voltage is larger than the second voltage.

In some implementations, the third time is a same time as the second time.

Certain aspects of the subject matter described here can be implemented as a method of performing a program operation by a memory device. The method includes applying, at a first time, a first voltage to a first select line coupled to a first select gate transistor, where the memory device includes a memory cell array. The memory cell array includes a memory string. The memory string includes the first select gate transistor, multiple memory cells, and a source select gate transistor. The multiple memory cells are positioned between the first select gate transistor and the source select gate transistor, and the source select gate transistor is coupled to a source line of the memory cell array. A second voltage is applied at a second time to the first select line coupled to the first select gate transistor, where the second time is after the first time, and the second voltage is larger than the first voltage.

The method of performing a program operation by a memory device can include one or more of the following features.

In some implementations, the method further includes applying, at a third time, a third voltage to a first word line coupled to a first memory cell in the memory string, where the third time is after the first time, and the third voltage is larger than the second voltage.

In some implementations, the method further includes applying, at a fourth time, a fourth voltage to the first word line coupled to the first memory cell in the memory string, where the fourth time is after the second time, and the fourth voltage is a programming voltage for the first memory cell in the memory string.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

As used in this disclosure, the terms "a," "an," or "the" are used to include one or more than one unless the context clearly dictates otherwise. The term "or" is used to refer to a nonexclusive "of" unless otherwise indicated. The statement "at least one of A and B" has the same meaning as "A, B, or A and B." In addition, the phraseology or terminology employed in this disclosure, and not otherwise defined, is for the purpose of description only and not of limitation. Any use of section headings is intended to aid reading of the document and is not to be interpreted as limiting; information that is relevant to a section heading may occur within or outside of that particular section.

As used in this disclosure, the term "about" or "approximately" can allow for a degree of variability in a value or range, for example, within 10%, within 5%, or within 1% of a stated value or of a stated limit of a range.

As used in this disclosure, the term "substantially" refers to a majority of, or mostly, as in at least about 50%, 60%, 70%, 80%, 90%, 95%, 96%, 97%, 98%, 99%, 99.5%, 99.9%, 99.99%, or at least about 99.999% or more.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "0.1% to about 5%" or "0.1% to 5%" should be interpreted to include about 0.1% to about 5%, as well as the individual values (for example, 1%, 2%, 3%, and 4%) and the sub-ranges (for example, 0.1% to 0.5%, 1.1% to 2.2%, 3.3% to 4.4%) within the indicated range. The statement "X to Y" has the same meaning as "about X to about Y," unless indicated otherwise. Likewise, the statement "X, Y, or Z" has the same meaning as "about X, about Y, or about Z," unless indicated otherwise.

Particular implementations of the subject matter have been described. Other implementations, alterations, and permutations of the described implementations are within the scope of the following claims as will be apparent to those skilled in the art. While operations are depicted in the drawings or claims in a particular order, such operations are not required be performed in the particular order shown or in sequential order, or that all illustrated operations be performed (some operations may be considered optional), to achieve desirable results. In certain circumstances, multi-tasking or parallel processing (or a combination of multi-tasking and parallel processing) may be advantageous and performed as deemed appropriate.

Moreover, the separation or integration of various system modules and components in the previously described implementations are not required in all implementations, and the described components and systems can generally be integrated together or packaged into multiple products.

Accordingly, the previously described example implementations do not define or constrain the present disclosure. Other changes, substitutions, and alterations are also possible without departing from the spirit and scope of the present disclosure.

What is claimed is:

1. A memory device, comprising:
   a memory cell array comprising a first memory string and a second memory string, wherein the first memory string comprises a first select gate transistor, a plurality of memory cells, and a source select gate transistor, the plurality of memory cells are positioned between the first select gate transistor and the source select gate transistor, and the source select gate transistor is coupled to a source line of the memory cell array; and
   a peripheral circuit coupled to the memory cell array and configured to perform a program operation of a first memory cell in the first memory string,
   wherein the peripheral circuit is configured to:
      apply, at a first time during a channel pre-charge phase of the program operation, a first voltage to a first select line coupled to the first select gate transistor to turn on the first select gate transistor;
      apply, at a second time during a channel boosting phase of the program operation after the channel pre-charge phase, a second voltage to the first select line coupled to the first select gate transistor, wherein the second time is after the first time, and the second voltage is larger than the first voltage; and
      maintain, from the first time to the second time, a ground reference voltage at a second select line coupled to a second select gate transistor in the second memory string to turn off the second select gate transistor.

2. The memory device according to claim 1, wherein the peripheral circuit is further configured to:
   apply, at a third time, a third voltage to a first word line coupled to the first memory cell in the first memory string, wherein the third time is after the first time, and the third voltage is larger than the second voltage.

3. The memory device according to claim 2, wherein a voltage of the first word line coupled to the first memory cell at the first time is smaller than the third voltage.

4. The memory device according to claim 2, wherein the third time is a same time as the second time.

5. The memory device according to claim 2, wherein the peripheral circuit is further configured to:
   apply, at a fourth time, a fourth voltage to the first word line coupled to the first memory cell in the first memory string, wherein the fourth time is after the second time, and the fourth voltage is a programming voltage for the first memory cell in the first memory string.

6. The memory device according to claim 5, wherein the peripheral circuit is further configured to:
   apply, from the second time to the fourth time, the second voltage to the first select line.

7. The memory device according to claim 5, wherein a voltage of the first select line coupled to the first select gate transistor is the second voltage during a time period when a voltage of the first word line coupled to the first memory cell in the first memory string is the fourth voltage.

8. The memory device according to claim 5, wherein the peripheral circuit is further configured to:
   apply, at the third time, a fifth voltage to a dummy word line coupled to a dummy memory cell in the first memory string.

9. The memory device according to claim 8, wherein a voltage of the dummy word line coupled to the dummy memory cell in the first memory string is the fifth voltage during a time period when a voltage of the first word line coupled to the first memory cell in the first memory string is the fourth voltage.

10. The memory device according to claim 8, wherein the peripheral circuit is further configured to:
   apply, at the third time, the fifth voltage to a second word line coupled to a second memory cell in the first memory string.

11. The memory device according to claim 10, wherein a voltage of the second word line coupled to the second memory cell in the first memory string is the fifth voltage during a time period when a voltage of the first word line coupled to the first memory cell in the first memory string is the fourth voltage.

12. The memory device according to claim 5, wherein a voltage of the first select line coupled to the first select gate transistor reaches the second voltage before the fourth time.

13. The memory device according to claim 1, wherein the first memory string further comprises a third select gate transistor, and the first select gate transistor is closer to the plurality of memory cells than the third select gate transistor.

14. The memory device according to claim 1, wherein the peripheral circuit is further configured to:
   apply, before the first time, a sixth voltage to a second select line coupled to the source select gate transistor.

15. The memory device according to claim 14, wherein the peripheral circuit is further configured to:
   apply, after the first time, a seventh voltage to the second select line coupled to the source select gate transistor, wherein the seventh voltage is smaller than the sixth voltage.

16. The memory device according to claim 15, wherein the peripheral circuit is further configured to:
   apply, before the first time, an eighth voltage to an array common source (ACS) line coupled to the first memory string, wherein the eighth voltage is larger than the seventh voltage and smaller than the sixth voltage.

17. The memory device according to claim 16, wherein the peripheral circuit is further configured to:
   apply, at the first time, the eighth voltage to the ACS line coupled to the first memory string.

18. The memory device according to claim 15, wherein the peripheral circuit is further configured to:
   apply, before the first time, a ninth voltage to a bit line coupled to another memory string of the memory cell array, wherein the ninth voltage is larger than the seventh voltage.

19. A memory system, comprising:
   a memory device, comprising:
      a memory cell array comprising a first memory string and a second memory string, wherein the first memory string comprises a first select gate transistor, a plurality of memory cells, and a source select gate transistor, the plurality of memory cells are positioned between the first select gate transistor and the source select gate transistor, and the source select gate transistor is coupled to a source line of the memory cell array; and a peripheral circuit coupled to the memory cell array and configured to perform a program operation of a first memory cell in the first memory string, wherein the peripheral circuit is configured to:

apply, at a first time during a channel pre-charge phase of the program operation, a first voltage to a first select line coupled to the first select gate transistor to turn on the first select gate transistor;

apply, at a second time during a channel boost phase of the program operation after the channel pre-charge phase, a second voltage to the first select line coupled to the first select gate transistor, wherein the second time is after the first time, and the second voltage is larger than the first voltage; and maintain, from the first time to the second time, a ground reference voltage at a second select line coupled to a second select gate transistor in the second memory string to turn off the second select gate transistor; and a controller coupled to the memory device and configured to send a signal to the memory device to initiate the program operation.

20. A method of performing a program operation by a memory device, the method comprising:

applying, at a first time during a channel pre-charge phase of the program operation, a first voltage to a first select line coupled to a first select gate transistor to turn on the first select gate transistor, wherein the memory device comprises a memory cell array, the memory cell array comprises a first memory string and a second memory string, the first memory string comprises the first select gate transistor, a plurality of memory cells, and a source select gate transistor, the plurality of memory cells are positioned between the first select gate transistor and the source select gate transistor, and the source select gate transistor is coupled to a source line of the memory cell array;

applying, at a second time during a channel boost phase of the program operation after the channel pre-charge phase, a second voltage to the first select line coupled to the first select gate transistor, wherein the second time is after the first time, and the second voltage is larger than the first voltage; and maintaining, from the first time to the second time, a ground reference voltage at a second select line coupled to a second select gate transistor in the second memory string to turn off the second select gate transistor.

* * * * *